US009929117B2

(12) United States Patent
Lee et al.

(10) Patent No.: US 9,929,117 B2
(45) Date of Patent: Mar. 27, 2018

(54) ELECTRONIC COMPONENT PACKAGE AND ELECTRONIC DEVICE INCLUDING THE SAME

(71) Applicant: SAMSUNG ELECTRO-MECHANICS CO., LTD., Suwon-si, Gyeonggi-do (KR)

(72) Inventors: Ji Hyun Lee, Suwon-si (KR); Sung Won Jeong, Suwon-si (KR); Ha Young Ahn, Suwon-si (KR); Shang Hoon Seo, Suwon-si (KR); Seung Yeop Kook, Suwon-si (KR)

(73) Assignee: SAMSUNG ELECTRO-MACHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/670,711

(22) Filed: Aug. 7, 2017

(65) Prior Publication Data

US 2017/0358548 A1    Dec. 14, 2017

Related U.S. Application Data

(63) Continuation of application No. 15/183,292, filed on Jun. 15, 2016, now Pat. No. 9,831,203.

(30) Foreign Application Priority Data

Nov. 18, 2015  (KR) .................. 10-2015-0161606

(51) Int. Cl.
 *H01L 23/00*  (2006.01)
 *H01L 23/48*  (2006.01)
 *H01L 23/31*  (2006.01)

(52) U.S. Cl.
 CPC .......... *H01L 24/14* (2013.01); *H01L 23/3114* (2013.01); *H01L 23/481* (2013.01);
 (Continued)

(58) Field of Classification Search
 CPC ... H01L 24/14; H01L 23/3114; H01L 23/481; H01L 24/06
 See application file for complete search history.

(56) References Cited

U.S. PATENT DOCUMENTS

2005/0023679 A1    2/2005  Liu
2005/0023683 A1    2/2005  Chung et al.
(Continued)

FOREIGN PATENT DOCUMENTS

KR    10-2004-0083192 A    10/2004
KR       2005-0013773 A     2/2005
(Continued)

OTHER PUBLICATIONS

U.S. Final Office Action dated Jul. 3, 2017 issued in U.S. Appl. No. 15/183,292.
(Continued)

*Primary Examiner* — Walter H Swanson
(74) *Attorney, Agent, or Firm* — McDermott Will & Emery LLP

(57) ABSTRACT

An electronic component package includes an electronic component, a redistribution layer electrically connected to the electronic component and having terminal connection pads, a passivation layer disposed on one side of the redistribution layer and having openings exposing at least portions of the terminal connection pads, and connection terminals disposed in the openings of the passivation layer and connected to the terminal connection pads. At least one of the openings of the passivation layer has a plurality of protrusion parts.

15 Claims, 12 Drawing Sheets

(52) U.S. Cl.
CPC ........ *H01L 24/06* (2013.01); *H01L 2224/024* (2013.01); *H01L 2224/0237* (2013.01); *H01L 2224/0239* (2013.01); *H01L 2224/0401* (2013.01); *H01L 2224/04105* (2013.01); *H01L 2224/05111* (2013.01); *H01L 2224/05116* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/12105* (2013.01); *H01L 2224/13014* (2013.01); *H01L 2224/13016* (2013.01); *H01L 2224/13023* (2013.01); *H01L 2224/13024* (2013.01); *H01L 2224/13111* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/1403* (2013.01); *H01L 2224/14131* (2013.01); *H01L 2224/14181* (2013.01); *H01L 2224/16225* (2013.01); *H01L 2225/1035* (2013.01); *H01L 2225/1058* (2013.01); *H01L 2924/0105* (2013.01); *H01L 2924/01013* (2013.01); *H01L 2924/01028* (2013.01); *H01L 2924/01029* (2013.01); *H01L 2924/01047* (2013.01); *H01L 2924/01079* (2013.01); *H01L 2924/01082* (2013.01); *H01L 2924/0665* (2013.01); *H01L 2924/07025* (2013.01); *H01L 2924/10252* (2013.01); *H01L 2924/10253* (2013.01); *H01L 2924/10329* (2013.01); *H01L 2924/14* (2013.01); *H01L 2924/145* (2013.01); *H01L 2924/1431* (2013.01); *H01L 2924/1432* (2013.01); *H01L 2924/1433* (2013.01); *H01L 2924/1436* (2013.01); *H01L 2924/1438* (2013.01); *H01L 2924/14335* (2013.01); *H01L 2924/186* (2013.01); *H01L 2924/3025* (2013.01); *H01L 2924/3511* (2013.01); *H01L 2924/3512* (2013.01)

(56) References Cited

U.S. PATENT DOCUMENTS

| | | |
|---|---|---|
| 2008/0157389 A1 | 7/2008 | Park et al. |
| 2010/0013081 A1 | 1/2010 | Toh et al. |
| 2012/0086109 A1 | 4/2012 | Kim et al. |
| 2015/0064899 A1* | 3/2015 | Ji .................... H01L 21/76898 |
| | | 438/614 |
| 2015/0147849 A1 | 5/2015 | Shin et al. |

FOREIGN PATENT DOCUMENTS

| | | |
|---|---|---|
| KR | 10-1362714 B1 | 2/2014 |
| KR | 10-1362715 B1 | 2/2014 |
| KR | 10-1368793 B1 | 3/2014 |

OTHER PUBLICATIONS

U.S. Non-Final Office Action dated Apr. 7, 2017 issued in U.S. Appl. No. 15/183,292.

* cited by examiner

I-I'

ELECTRONIC COMPONENT PACKAGE AND ELECTRONIC DEVICE INCLUDING THE SAME

CROSS-REFERENCE TO RELATED APPLICATION

This application is a continuation patent application of U.S. patent application Ser. No. 15/183,292, filed on Jun. 15, 2016 which claims benefit of priority to Korean Patent Application No. 10-2015-0161606 filed on Nov. 18, 2015, with the Korean Intellectual Property Office, the disclosure of which is incorporated herein by reference.

TECHNICAL FIELD

The present disclosure relates to an electronic component package and an electronic device including the same.

BACKGROUND

An electronic component package refers to a type of package technology for electrically connecting an electronic component to a printed circuit board (PCB), for example, a main board of an electronic device, or the like, and protecting the electronic component from external impacts, which is distinguished from a technology of embedding an electronic component in a printed circuit board, for example, an interposer substrate. Meanwhile, a major recent trend in the development of technology related to electronic components has been to reduce the size of electronic components. Therefore, in the field of package technology, in accordance with a rapid increase in demand for a small electronic component, or the like, implement an electronic component package having a small size and including a plurality of pins has been demanded.

As a type of package technology suggested in order to satisfy the technical demand as described above, a wafer level package (WLP) using a redistribution wiring of an electrode pad of an electronic component formed on a wafer has been suggested. An example of such a wafer level package includes a fan-in wafer level package and a fan-out wafer level package. Particularly, the fan-out wafer level package has a small size and is advantageous in implementing a plurality of pins. Therefore, recently, the fan-out wafer level package has been actively developed.

Meanwhile, generally, in a case in which the electronic component package is mounted on the main board of the electronic device, or the like, since a difference between coefficients of thermal expansion (CTEs) of the electronic component and the main board is significantly high, a difference between effective coefficients of thermal expansion of the electronic component package and the main board is intensified. As a result, in a case in which the electronic component package mounted on the main board is exposed to a harsh environment, a crack may be generated in a connection terminal, for example, a solder ball, connecting the electronic component package and the main board to each other.

SUMMARY

An aspect of the present disclosure may provide a new electronic component package in which board level reliability is improved, and an electronic device including the same.

According to an aspect of the present disclosure, a shape of an opening exposing a terminal connection pad may be changed to have a shape other than a circular shape.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, the present disclosure will be described with reference to the accompanying drawings. In the accompanying drawings, shapes and dimensions of components may be exaggerated and shortened for clarity.

Electronic Device

Figure 1:
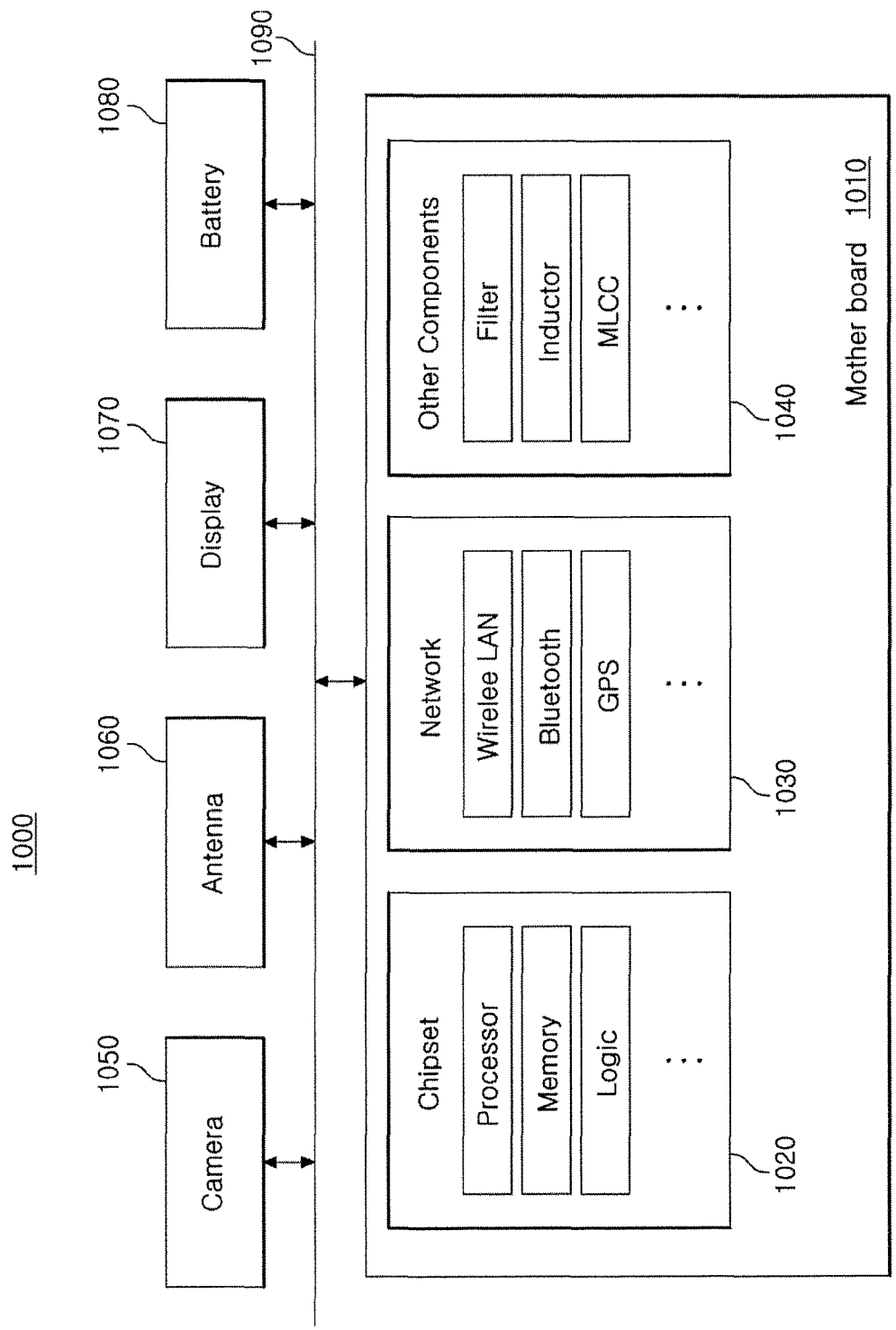
FIG. 1 is a block diagram schematically illustrating an example of an electronic device system.

FIG. 1 is a block diagram schematically illustrating an example of an electronic device system.

Referring to FIG. 1, an electronic device 1000 may accommodate a mother board 1010 therein. Chip related components 1020, network related components 1030, other components 1040, and the like, may be physically and/or electrically connected to the mother board 1010. These components may be connected to other component to be described below to form various signal lines 1090.

The chip related components 1020 may include a memory chip such as a volatile memory (for example, a dynamic random access memory (DRAM)), a non-volatile memory (for example, a read only memory (ROM)), a flash memory, etc.; an application processor chip such as a central processor (for example, a central processing unit (CPU)), a graphic processor (for example, a graphic processing unit (GPU)), a digital signal processor, a cryptographic processor, a micro processor, a micro controller, etc.; a logic chip such as an analog-to-digital converter, an application-specific integrated circuit (ASIC), etc.; and the like. However, the chip related components 1020 are not limited thereto, but may also include other types of chip related components. In addition, these components 1020 may be combined with each other.

The network related components 1030 may include protocols such as wireless fidelity (Wi-Fi) (Institute of Electrical and Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high-speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, 5G protocols and any other wireless and wired protocols designated after the above-mentioned protocols. However, the network related components 1030 are not limited thereto, but may also include any of a plurality of other wireless or wired standards or protocols. In addition, these components 1030 may be combined with each other together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, but may also include passive components used for various other purposes, and the like. In addition, these components 1040 may be combined with each other together with the chip related components 1020 and/or the network related components 1030 described above.

The electronic device 1000 may include other components that are or are not physically and/or electrically connected to the mother board 1010 depending on a kind thereof. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), amass storage (for example, a hard disk drive) (not illustrated), a compact disk (CD) (not illustrated), a digital versatile disk (DVD) (not illustrated), and the like. However, these other components are not limited thereto, but may also include other components used for various purposes depending on a kind of electronic device 1000.

The electronic device 1000 may be a smart phone, a personal digital assistant, a digital video camera, a digital still camera, a network system, a computer, a monitor, a tablet, a laptop, a netbook, a television, a video game machine, a smart watch, or the like. However, the electronic device 1000 is not limited thereto, but may also be any other electronic device processing data.

Figure 2:
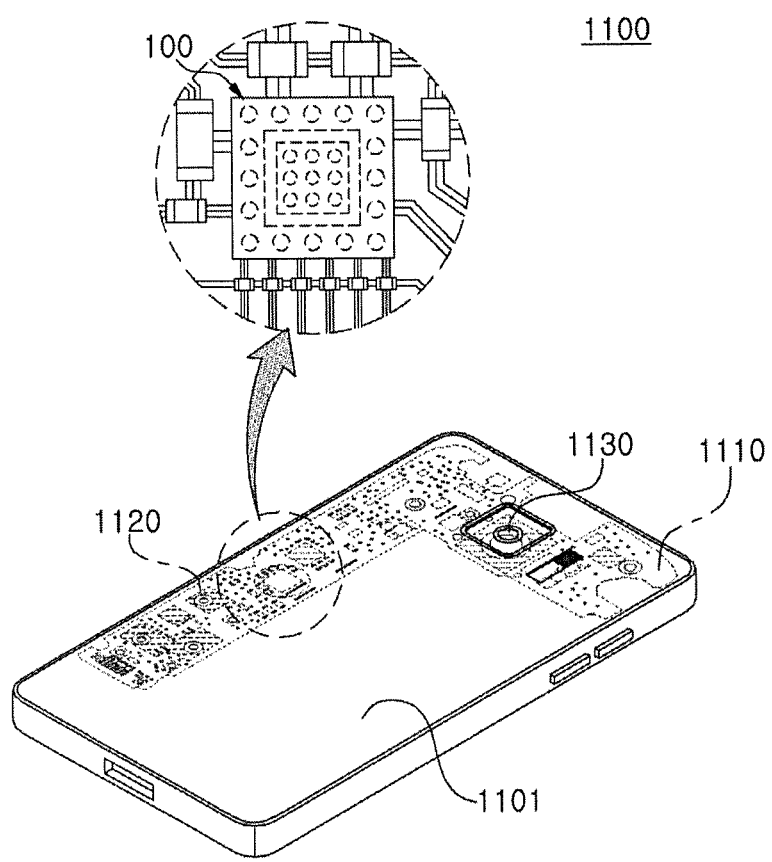
FIG. 2 is a view schematically illustrating an example of an electronic component package used in an electronic device.

FIG. 2 is a view schematically illustrating an example of an electronic component package used in an electronic device.

The electronic component package may be used for various purposes in the various electronic devices 1000 as described above. For example, a main board 1110 may be accommodated in a body 1101 of a smart phone 1100, and various electronic components 1120 may be physically and/or electrically connected to the main board 1110. In addition, another component that may be or may not be physically and/or electrically connected to the main board 1110, such as a camera 1130, may be accommodated in the body 1101. Here, some of the electronic components 1120 may be the chip related components as described above, and the electronic component package 100 may be, for example, an application processor among the chip related components, but are not limited thereto.

Electronic Component Package

Figure 3:
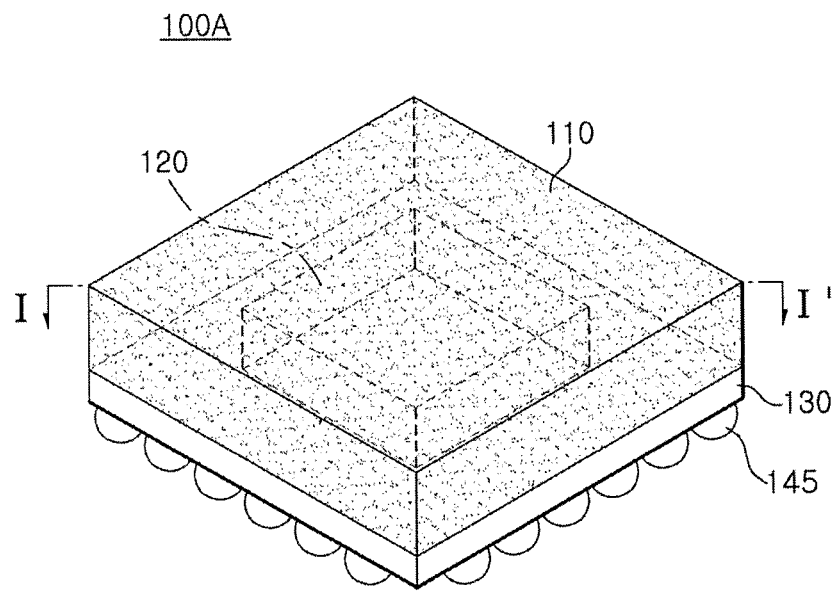
FIG. 3 is a perspective view schematically illustrating an example of an electronic component package.

FIG. 3 is a perspective view schematically illustrating an example of an electronic component package.

Figure 4:
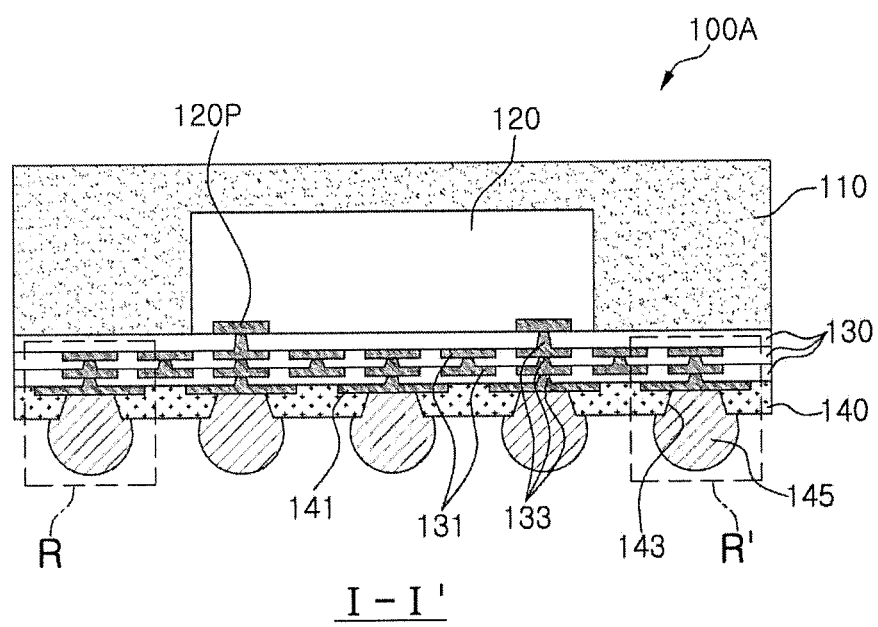
FIG. 4 is a schematic cross-sectional view of the electronic component package taken along line I-I' of FIG. 3.

FIG. 4 is a schematic cross-sectional view of the electronic component package taken along line I-I' of FIG. 3.

FIGS. 5A through 5D are plan views schematically illustrating an example of a region R or R' in FIG. 4.

Referring to FIGS. 3 through 5D, an electronic component package 100A according to an example may include an electronic component 120; redistribution layers 130, 131, 133, 141, and 142 electrically connected to the electronic component 120 and having terminal connection pads 141; a passivation layer 140 disposed on one side of the redistribution layers 130, 131, 133, 141, and 142 and having openings 143 exposing at least portions of the terminal connection pads 141; and connection terminals 145 disposed in the openings 143 of the passivation layer 140 and connected to the terminal connection pads 141. Openings 143 disposed in at least regions R and R' in which stress is concentrated among the openings 143 of the passivation layer 140 may have a plurality of protrusion parts 143P.

Generally, in a case in which the electronic component package is mounted on the main board of the electronic device, or the like, since a difference between coefficients of thermal expansion (CTEs) of the electronic component and the main board is significantly large (in a case in which the electronic component is an Si based integrated circuit, a CTE of the electronic component is approximately 3 ppm, and a CTE of the main board is approximately 20 to 30 ppm), a difference between effective coefficients of thermal expansion of the electronic component package and the main board may become significantly large. As a result, in a case in which the electronic component package mounted on the main board is exposed to a harsh environment, a crack may be generated in a connection terminal, for example, a solder ball, connecting the electronic component package and the main board to each other. That is, warpage may be generated in the electronic component package and the main board due to the difference between the CTEs of the electronic component and the main board. Here, the warpage generated in the electronic component package and the warpage generated in the main board act in opposite directions, such that stress may be concentrated on the connection terminal, for example, the solder ball, connecting the electronic component package and the main board to each other. As a result, the crack may be generated.

On the other hand, in a case in which the openings 143 disposed in at least the regions R and R' in which the stress is concentrated among the openings 143 of the passivation layer 140 exposing the terminal connection pads 141 are implemented to have the plurality of protrusion parts 143P rather than being implemented in a circular shape, as in the electronic component package 100A according to an example, areas of the terminal connection pads 141 supporting the connection terminals 145 may be increased, such that adhesion between the connection terminals 145 and the terminal connection pads 141 may be increased. In addition, an anchoring effect may be expected by the protrusion parts 143P. Therefore, even in a case in which the warpage is generated in the electronic component package and the main board due to the difference between the CTEs of the electronic component and the main board, generation of cracks in the connection terminals 145 may be prevented. The openings 143 disposed in other regions may also have the plurality of protrusion parts 143P.

Hereinafter, respective components of the electronic component package 100A according to an example will be described in more detail.

The electronic component 120 may be various active components (for example, a diode, a vacuum tube, a transistor, and the like) or passive components (for example, an inductor, a condenser, a resistor, and the like). Alternatively, the electronic component 120 may be an integrated circuit (IC) indicating a chip in which hundreds to millions or more of elements are integrated. The integrated circuit may be an application processor chip such as a central processor (for example, a CPU), a graphic processor (for example, a GPU), a digital signal processor, a cryptographic processor, a micro processor, a micro controller, or the like, but is not limited thereto.

The electronic component 120 may have electrode pads 120P electrically connected to the redistribution layers 130, 131, 133, 141, and 142. The electronic pad 120P may electrically connect the electronic component 120 to the outside, and a material of the electrode pad 120P is not particularly limited as long as it is a conductive material. The conductive material may be copper (Cu), aluminum (Al), silver (Ag), tin (Sn), gold (Au), nickel (Ni), lead (Pd), or an alloy thereof, etc., but is not limited thereto. The electrode pads 120P may be redistributed by the redistribution layers 130, 131, 133, 141, and 142. The electrode pad 120P may have a buried form or a protruding form.

In the case in which the electronic component 120 is the integrated circuit, the electronic component may have a body (not denoted by a reference number), a passivation layer (not denoted by a reference number), and the electrode pads 120P. The body may be formed on the basis of, for example, an active wafer. In this case, silicon (Si), germanium (Ge), gallium arsenide (GaAs), or the like, may be used as a basic material of the body. The passivation layer may serve to protect the body from the outside, and may be formed of, for example, an oxide layer, a nitride layer, or the like, or be formed of a double layer of an oxide layer and a nitride layer. A conductive material such as copper (Cu), aluminum (Al), silver (Ag), tin (Sn), gold (Au), nickel (Ni), lead (Pd), or an alloy thereof, etc., may be used as a material of the electrode pad 120P. A layer on which the electrode pads 120P are formed may become an active layer.

A thickness of the electronic component 120 in a cross section thereof is not particularly limited, but may be changed depending on a kind of electronic component 120. For example, in a case in which the electronic component is the integrated circuit, a thickness of the electronic component may be about 100 µm to 480 µm, but is not limited thereto. The thickness of the electronic component 120 in the cross-section thereof may be the same as or be thinner than that of a frame 115 in a cross-section thereof to be described below. In this case, the electronic component 120 may be more easily protected.

The redistribution layers 130, 131, 133, 141, and 142 may redistribute the electrode pads 120P of the electronic component 120. Tens to hundreds of electrode pads 120P having various functions may be redistributed through the redistribution layers 130, 131, 133, 141, and 142, and may be physically and/or electrically connected to the outside through the connection terminals 145 depending on functions thereof. The redistribution layers 130, 131, 133, 141, and 142 may include insulating layers 130, various kinds of wiring patterns 131, 141, and 142 disposed on the insulating layers 130, and vias 133 penetrating through the insulating layers 130. The redistribution layers 130, 131, 133, 141, and 142 are not necessarily formed of a plurality of layers, but may also be formed of a single layer in some cases. In addition, the insulating layer 130 and the passivation layer 140 are not necessarily formed of two layers, but may also be formed of a plurality of layers more than two layers.

An insulating material may be used as a material of the insulating layer 130. Here, the insulating material may be a thermosetting resin such as an epoxy resin, a thermoplastic resin such as a polyimide resin, a resin having a reinforcement material such as a glass fiber or an inorganic filler impregnated in the thermosetting resin and the thermoplastic resin, for example, prepreg, Ajinomoto Buildup Film (ABF), FR-4, Bismaleimide Triazine (BT), or the like. In a case in which a photosensitive insulating material such as a photo imagable dielectric (PID) resin is used as a material of the insulating layer 130, the insulating layer 130 may be formed at a thinner thickness, and a fine pitch may be easily implemented. The respective insulating layers 130 may be formed of the same insulating material or different insulating materials. In a case in which the respective insulating layers 130 are formed of the same insulating material, boundaries between the respective insulating layers 130 may not be apparent in some case, but are not necessarily limited thereto.

A first wiring pattern 131 may serve as a redistribution wiring, or the like, and a conductive material such as copper (Cu), aluminum (Al), silver (Ag), tin (Sn), gold (Au), nickel (Ni), lead (Pd), or an alloy thereof, etc., may be used as a material of the first wiring pattern 131. The first wiring pattern 131 may perform various functions depending on a design of the corresponding layers. For example, the first wiring pattern 131 may serve as a ground (GND) pattern, a power (PWR) pattern, a signal (S) pattern, and the like. Here, the signal (S) pattern may include various signals except for the ground (GND) pattern, the power (PWR) pattern, and the like, for example, data signals, and the like. In addition, the first wiring pattern 131 may also serve as pads such as via pads, or the like.

A second wiring pattern 141 may serve as a pad of the connection terminal 145. That is, the second wiring pattern 141 may be the terminal connection pad 141. A third wiring pattern 142 may be connected to the second wiring pattern 141, and may serve as a ground (GND) pattern, a power (PWR) pattern, a signal (S) pattern, and the like. A conductive material such as copper (Cu), aluminum (Al), silver (Ag), tin (Sn), gold (Au), nickel (Ni), lead (Pd), or an alloy thereof, etc., may be used as materials of the second and third wiring patterns 141 and 142. A surface treatment layer may be further formed on exposed regions of the second wiring pattern 141, if necessary. The surface treatment layer is not particularly limited as long as it is known in the related art, and may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The vias 133 may electrically connect the wiring patterns 131, 141, and 122, the electrode pads 120P, and the like, formed on different layers to each other, thereby forming an electrical path within the electronic component package 100A. A conductive material such as copper (Cu), aluminum (Al), silver (Ag), tin (Sn), gold (Au), nickel (Ni), lead (Pd), or an alloy thereof, etc., may be used as a material of the via 133. The via 133 may be completely filled with a conductive material. Alternatively, a conductive material may be formed along a wall of the via. In addition, the via 133 may have all of the shapes known in the related art, such as a tapered shape in which a diameter of the via becomes small toward a lower surface, a reverse tapered shape in which a diameter of the via becomes large toward a lower surface, a cylindrical shape, and the like.

The passivation layer 140 may be to protect the redistribution layers 130, 131, 133, 141, and 142 from external physical and chemical damage, or the like. A material of the passivation layer 140 is not particularly limited. For example, a solder resist may be used as a material of the passivation layer 140. That is, the passivation layer 140 may be a solder resist layer. In addition, the same material as that of the insulating layer 130 of the redistribution layers 130, 131, 133, 141, and 142, for example, the same PID resin may also be used as a material of the passivation layer 140. The passivation layer 140 is generally a single layer, but may also be formed of multiple layers, if necessary.

The passivation layer 140 may have the openings 143 exposing at least portions of the terminal connection pads 141 Here, the openings 143 disposed in at least the portion R and R' in which the stress is concentrated may be implemented in a shape other than a simple circular shape. That is, the openings 143 disposed in at least the corresponding regions may have the plurality of protrusion parts 141P together with a circular shape. Exposed areas of the terminal connection pads 141 may be increased by the plurality of protrusion parts 143P. Therefore, the areas of the terminal connection pads 141 supporting the connection terminals 145 may be increased. In addition, the anchoring effect may be provided through the plurality of protrusion parts 143P. As a result, much stronger adhesion between the terminal connection pads 141 and the connection terminals 145 may be implemented, and board level reliability may be improved.

Figure 5A:
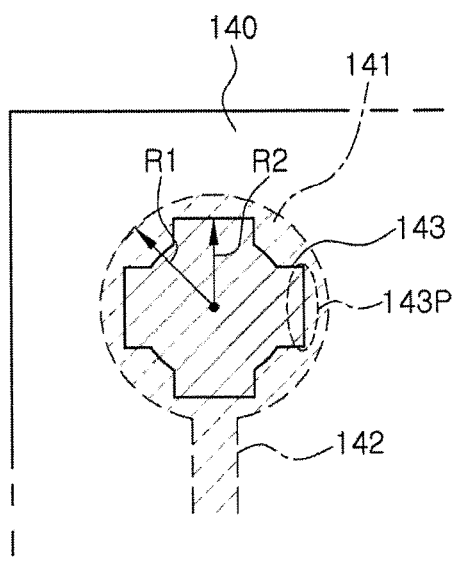
FIGS. 5A through 5D are plan views schematically illustrating an example of a region R or R' in FIG. 4.
Figure 5B:
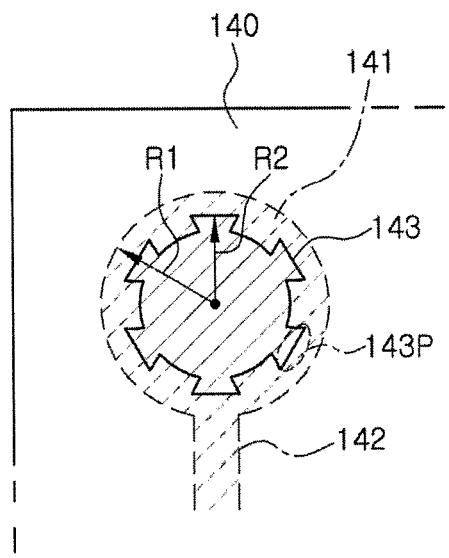
Figure 5C:
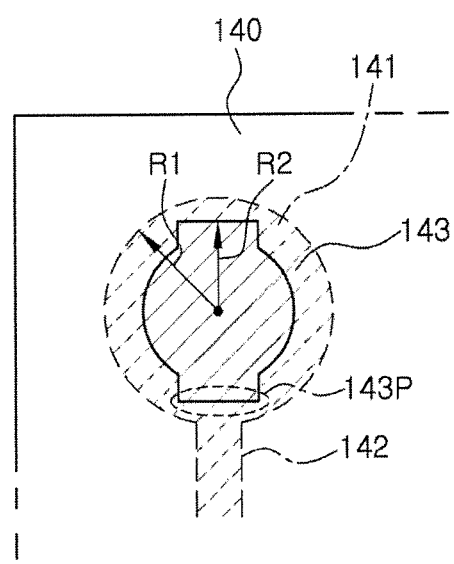
Figure 5D:
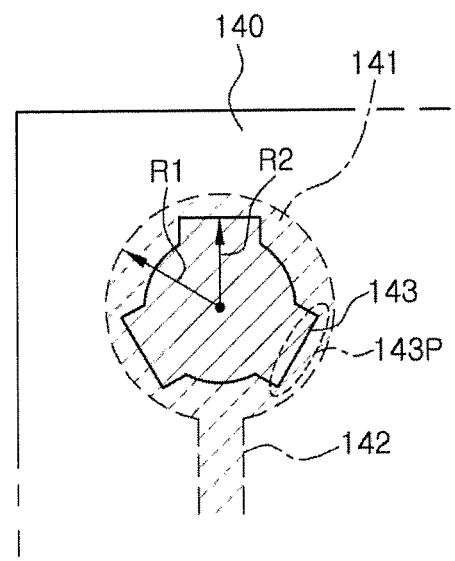

An opening region may have a plurality of protrusions 143P protruding in any directions. For example, the opening region may have a plurality of protrusions 143P protruding in four directions, as illustrated in FIG. 5A, have a plurality of protrusions 143P protruding in six directions, as illustrated in FIG. 5B, have a plurality of protrusions 143P protruding in two directions, as illustrated in FIG. 5C, or have a plurality of protrusions 143P protruding in three directions, as illustrated in FIG. 5D, but is not limited thereto. The more the number of protrusion parts 143P, the smaller the opened areas of the respective protrusion parts. Therefore, it is not necessarily advantageous that the number of protrusion parts 143P is large, but it may be more advantageous that an appropriate number of protrusion parts, for example, four protrusion parts protrude in the four directions, as illustrated in FIG. 5A.

The plurality of protrusion parts 143P may have a shape in which at least some of corners thereof are angulated more than a curved surface. For example, the plurality of protrusion parts 143P may have a polygonal shape such as a quadrangular shape, or the like, as illustrated in FIGS. 5A through 5D. In this case, since the connection terminal 145 may interlock with the protrusion parts 143P, the anchoring effect may be improved.

When a distance from the center of the terminal connection pad 141 to an edge of the terminal connection pad 141 is R1 and a distance from the center of the terminal connection pad 141 to an edge of the protrusion part 143P is R2, R1 may be larger than R2. For example, the opening 143 may be solder mask defined (SMD) type. That is, the passivation layer 140 may cover the entire edge of the terminal connection pad 141. In this case, securing of the support areas and the anchoring effect as described above may be more effectively implemented.

The connection terminals 145 may be to physically and/or electrically connect the electronic component package 100A to the outside. For example, the electronic component package 100A may be mounted on the main board of the electronic device through the connection terminals 145. The connection terminals 145 may be disposed in the openings 143, and be connected to the terminal connection pads 141 exposed through the openings 143. Therefore, the connection terminals 145 may also be electrically connected to the electronic component 120.

The connection terminal 145 may be formed of a conductive material, for example, copper (Cu), aluminum (Al), silver (Ag), tin (Sn), gold (Au), nickel (Ni), lead (Pd), solder, or the like, but is not particularly limited thereto. The connection terminal 145 may be a land, a ball, a pin, or the like. The connection terminal 145 may be formed of multiple layers or a single layer. In a case in which the connection terminal 145 is formed of the multiple layers, the connection terminal 145 may contain a copper pillar and a solder, and in a case in which the connection terminal 145 is formed of the single layer, the connection terminal 145 may contain a tin-silver solder or copper. However, this is only an example, and the connection terminal 145 is not limited thereto.

At least one of the connection terminals 145 may be disposed in a fan-out region. The fan-out region means a region except for a region in which the electronic component is disposed. That is, the electronic component package 100A according to an example may be a fan-out package. The fan-out package may have reliability better than that of a fan-in package, may implement a plurality of I/O terminals, and may easily perform 3D interconnection. In addition, since the fan-out package may be mounted on the electronic device without using a separate substrate as compared to a ball grid array (BGA) package, a land grid array (LGA) package, or the like, the fan-out package may be manufactured at a thin thickness, and may have excellent price competitiveness.

The number, an interval, a disposition form, and the like, of connection terminals 145 are not particularly limited, but may be sufficiently modified depending on design particulars by those skilled in the art. For example, the number of connection terminals 145 may be several ten to several thousand depending on the number of electrode pads 120P of the electronic component 120. However, the number of connection terminals 145 is not limited thereto, but may also be several ten to several thousand or more or several ten to several thousand or less.

The electronic component package 100A according to an example may further include an encapsulant 110 encapsulating the electronic component 120. The encapsulant 110 may be to protect the electronic component 120. A detailed material of the encapsulant 110 is not particularly limited. For example, an insulating material may be used as a material of the encapsulant 110. Here, the insulating material may be a thermosetting resin such as an epoxy resin, a thermoplastic resin such as a polyimide resin, a resin having a reinforcement material such as a glass fiber or an inorganic filler impregnated in the thermosetting resin and the thermoplastic resin, for example, prepreg, ABF, FR-4, BT, a PID resin, or the like. In addition, the known molding material such as an epoxy molding compound (EMC), or the like, may also be used.

The encapsulant 110 may contain conductive particles in order to block an electromagnetic wave, if necessary. For example, the conductive particle may be any material that may block the electromagnetic wave, for example, copper (Cu), aluminum (Al), silver (Ag), tin (Sn), gold (Au), nickel (Ni), lead (Pd), solder, or the like, but is not particularly limited thereto.

Figure 6:
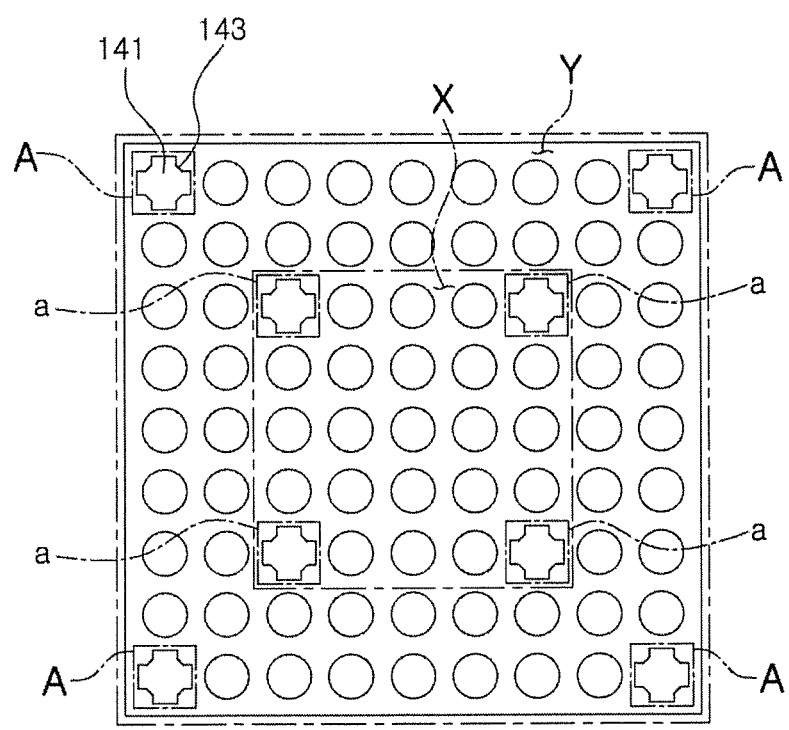
FIG. 6 is a plan view schematically illustrating an example of an array of openings formed in a passivation layer.

FIG. 6 is a plan view schematically illustrating an example of an array of openings formed in a passivation layer.

Referring to FIG. 6, a passivation layer 140 may include a first region X corresponding to a region in which the electronic component 120 is disposed and a second region Y enclosing the first region X, when viewed from the top. Here, peak parts of corners A of the outermost side of the second region Y may be regions corresponding to the regions R and R' described above. The peak parts of corners A may be regions in which the stress is particularly concentrated on the connection terminals 145 in a case in which the electronic component package 100A is mounted on the main board, as described above. Therefore, in a case in which the openings 143 having the plurality of protrusion parts 141P as described above are formed in at least the peak parts of the corners A of the outermost side of the second region Y in order to alleviate the stress, the board level reliability of the electronic component package 100A may be improved. The openings 143 having the plurality of protrusion parts 141P may also be disposed in regions other than the peak parts of the corners A. In addition, the peak parts of corners a of the outermost side of the first region X may also be regions in which the stress is concentrated. Therefore, the openings 143 having the plurality of protrusion parts 141P as described above may also be formed in the peak parts of the corners a. Meanwhile, the outermost side means the outermost region in which the openings may be disposed, and an outer side means an outer region including the outermost region. Here, a case in which discrimination between the outer region and an inner region is obscure, that is, an intermediate point between the center and the outermost side is interpreted as the outer region. In addition, the peak parts of the corner means a corner portion of any region in which the openings may be disposed, and the corner means a corner portion extended from the peak part of the corner so that a predetermined number of openings may be further disposed.

Figure 7:
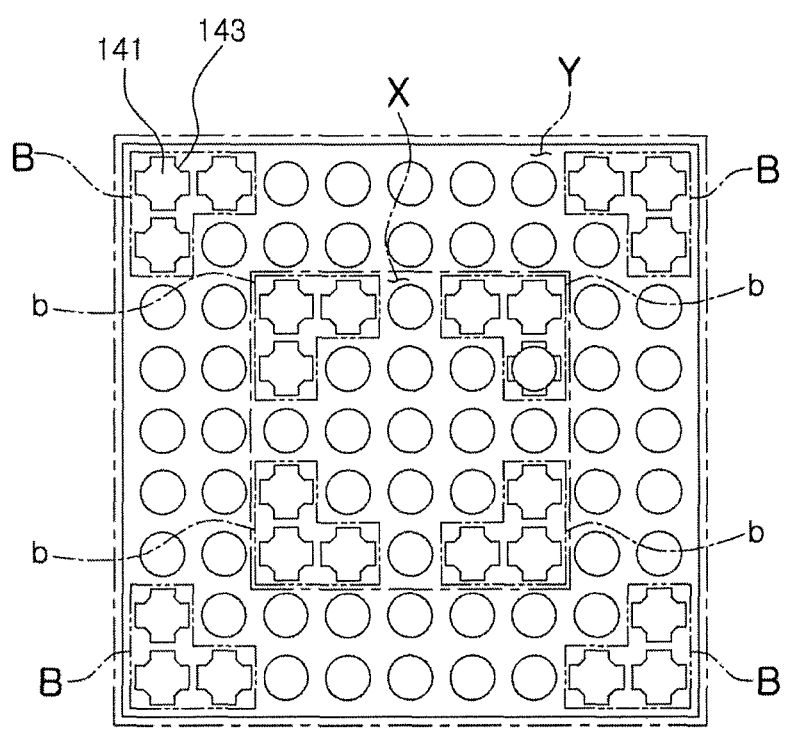
FIG. 7 is a plan view schematically illustrating another example of an array of openings formed in a passivation layer.

FIG. 7 is a plan view schematically illustrating another example of an array of openings formed in a passivation layer.

Referring to FIG. 7, a passivation layer 140 may include a first region X corresponding to a region in which the electronic component 120 is disposed and a second region Y enclosing the first region X, when viewed from the top. Here, corners B of the outermost side of the second region Y may be regions corresponding to the regions R and R' described above. The corners B may be regions in which the stress is particularly concentrated on the connection terminals 145 in the case in which the electronic component package 100A is mounted on the main board, as described above. Therefore, in a case in which the openings 143 having the plurality of protrusion parts 141P as described above are formed in at least the corners B of the outermost side of the second region Y in order to alleviate the stress, the board level reliability of the electronic component package 100A may be improved. The openings 143 having the plurality of protrusion parts 141P may also be disposed in regions other than the corners B. In addition, corners b of the outermost side of the first region X may also be regions in which the stress is concentrated. Therefore, the openings 143 having the plurality of protrusion parts 141P as described above may also be formed in the corners b.

Figure 8:
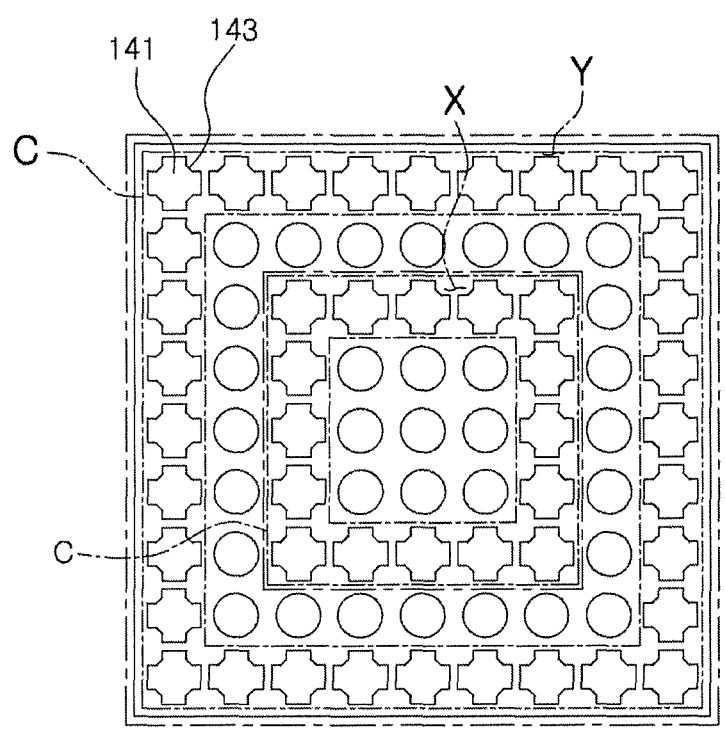
FIG. 8 is a plan view schematically illustrating another example of an array of openings formed in a passivation layer.

FIG. 8 is a plan view schematically illustrating another example of an array of openings formed in a passivation layer.

Referring to FIG. 8, a passivation layer 140 may include a first region X corresponding to a region in which the electronic component 120 is disposed and a second region Y enclosing the first region X, when viewed from the top. Here, the outermost side C of the second region Y may be a region corresponding to the regions R and R' described above. The outermost side C may be a region in which the stress is particularly concentrated on the connection terminals 145 in the case in which the electronic component package 100A is mounted on the main board, as described above. Therefore, in a case in which the openings 143 having the plurality of protrusion parts 141P as described above are formed in at least the outermost side C of the second region Y in order to alleviate the stress, the board level reliability of the electronic component package 100A may be improved. The openings 143 having the plurality of protrusion parts 141P may also be disposed in regions other than the outermost side C. In addition, the outermost side c of the first region X may also be a region in which the stress is concentrated. Therefore, the opening 143 having the plurality of protrusion parts 141P as described above may also be formed in the outermost side c of the first region X.

Figure 9:
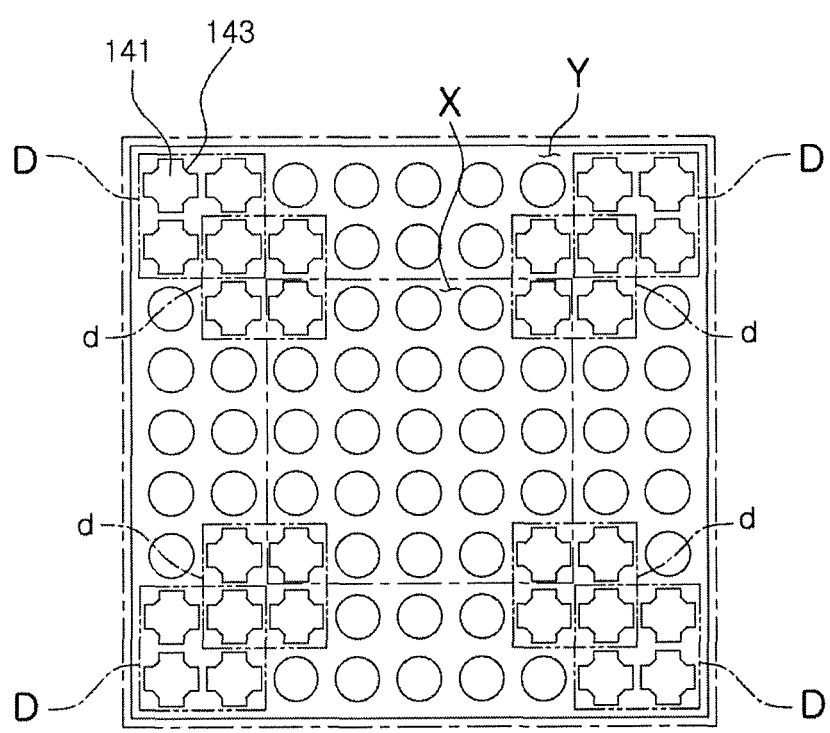
FIG. 9 is a plan view schematically illustrating another example of an array of openings formed in a passivation layer.

FIG. 9 is a plan view schematically illustrating another example of an array of openings formed in a passivation layer.

Referring to FIG. 9, a passivation layer 140 may include a first region X corresponding to a region in which the electronic component 120 is disposed and a second region Y enclosing the first region X, when viewed from the top. Here, corners D of an outer side of the second region Y may be regions corresponding to the regions R and R' described above. The corners D may be regions in which the stress is particularly concentrated on the connection terminals 145 in the case in which the electronic component package 100A is mounted on the main board, as described above. Therefore, in a case in which the openings 143 having the plurality of protrusion parts 141P as described above are formed in at least the corners D of the outer side of the second region Y in order to alleviate the stress, the board level reliability of the electronic component package 100A may be improved. The openings 143 having the plurality of protrusion parts 141P may also be disposed in regions other than the corners D. In addition, in the case in which the electronic component package 100A is mounted on the main board, the stress may also be further concentrated on the connection terminals 145 in the peak parts of the corners of the outermost side of the first region X and portions of the second region Y enclosing the peak parts of the corners of the outermost side of the first region X in which a plurality of heterogeneous materials meet each other d. Therefore, the openings 143 having the plurality of protrusion parts 141P as described above may also be formed in the corners of the outermost side of the first region X and the portions d of the second region Y enclosing the corners of the outermost side of the first region X.

Figure 10:
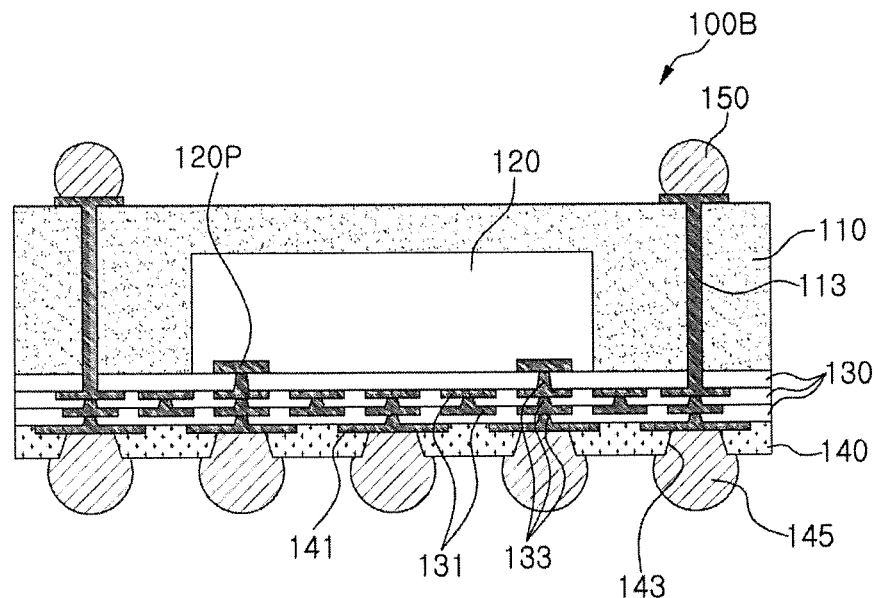
FIG. 10 is a cross-sectional view schematically illustrating another example of an electronic component package.

FIG. 10 is a cross-sectional view schematically illustrating another example of an electronic component package.

Referring to FIG. 10, an electronic component package 100B according to another example may be a package-on-package (PoP) type. That is, the electronic component package 100B according to another example may further include through-wirings 113 penetrating through the encapsulant 110. In addition, the electronic component package 100B may further include connection terminals 150 connected to the through-wirings 113. The other components are the same as the components as described above.

The through-wirings 113 may serve to electrically connect another package, a surface-mounting technology (SMT) component, and the like, and the electrical component 120 to each other when another package, a surface-mounting technology (SMT) component, and the like, are disposed on the electronic component package 100B. A conductive material such as copper (Cu), aluminum (Al), silver (Ag), tin (Sn), gold (Au), nickel (Ni), lead (Pd), or an alloy thereof, etc., may be used as a material of the through-wiring 113. The number, an interval, a disposition form, and the like, of through-wirings 113 are not particularly limited, but may be sufficiently modified depending on design particulars by those skilled in the art. Therefore, a detailed description for the through-wirings 113 will be omitted.

The connection terminals 150 may serve as connection terminals connecting the electronic component package 100B to another package, and the like, when another package, and the like, are disposed on the electronic component package 100B. The connection terminal 150 may be formed of a conductive material, for example, copper (Cu), aluminum (Al), silver (Ag), tin (Sn), gold (Au), nickel (Ni), lead (Pd), solder, or the like, but is not particularly limited thereto. The connection terminal 150 may be a land, a ball, a pin, or the like. However, the connection terminal 150 may be generally a solder ball. The connection terminal 150 may be formed of multiple layers or a single layer. In a case in which the connection terminal 150 is formed of the multiple layers, the connection terminal 150 may contain a copper pillar and a solder, and in a case in which the connection terminal 150 is formed of the single layer, the connection terminal 150 may contain a tin-silver solder or copper. However, this is only an example, and the connection terminal 150 is not limited thereto.

Figure 11:
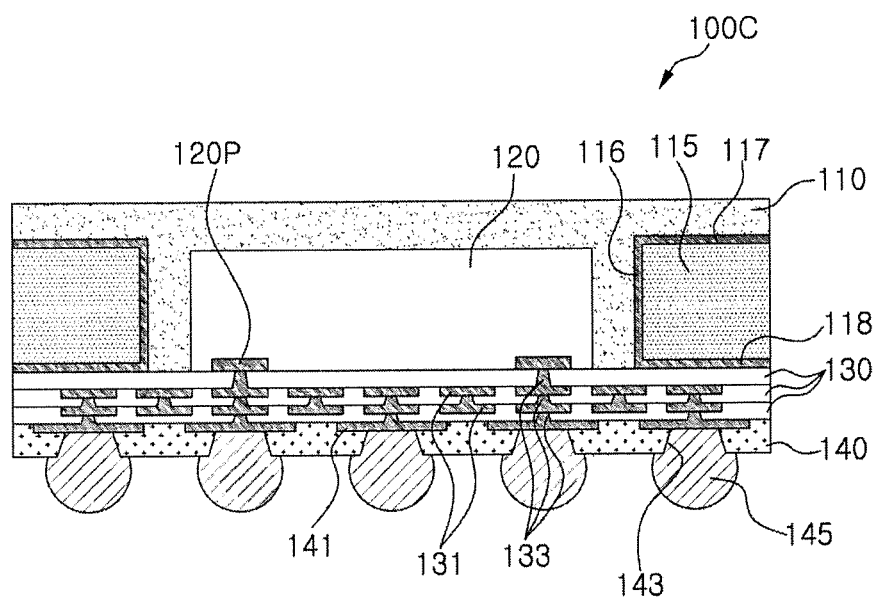
FIG. 11 is a cross-sectional view schematically illustrating another example of an electronic component package.

FIG. 11 is a cross-sectional view schematically illustrating another example of an electronic component package.

Referring to FIG. 11, an electronic component package 100C according to another example may be a panel level package (PLP) type. That is, the electronic component package 100C according to anther example may further include a frame 115 disposed on the insulating layer 130 of the redistribution layer and having a through-hole. Here, the electronic component 120 may be disposed in the through-hole of the frame 115. Metal layers 116, 117, and 118 may be disposed on an inner surface of the through-hole of the frame 115, an upper surface of the frame 115, and/or a lower surface of the frame 115, if necessary. The other components are the same as the components as described above.

The frame 115 may support the electronic component package 100C, and rigidity of the electronic component package 100C may be maintained and uniformity of a thickness of the electronic component package 100C may be secured by the frame 115. The frame 115 may have the upper surface and the lower surface opposing the upper surface. Here, the through-hole may penetrate between the upper surface and the lower surface. The electronic component 120 may be disposed in the through-hole so as to be spaced apart from the frame 115. As a result, the surrounding of side surfaces of the electronic component 120 may be enclosed by the frame 115. A material of the frame 115 is not particularly limited as long as the frame may support the electronic component package. For example, an insulating material may be used as a material of the frame 115. Here, the insulating material may be a thermosetting resin such as an epoxy resin, a thermoplastic resin such as a polyimide resin, a resin having a reinforcement material such as a glass fiber or an inorganic filler impregnated in the thermosetting resin and the thermoplastic resin, for example, prepreg, ABF, FR-4, BT, or the like. Alternatively, a metal having excellent rigidity and thermal conductivity may be used as a material of the frame 115. Here, the metal may be a Fe—Ni based alloy. In this case, a Cu plating may also be formed on a surface of the Fe—Ni based alloy in order to secure adhesion between the Fe—Ni based alloy and a molding material, an interlayer insulating material, or the like. In addition to the materials as described above, glass, ceramic, plastic, or the like, may also be used as a material of the frame 115. A thickness of the frame 115 in a cross section thereof is not particularly limited, but may be designed depending on a thickness of the electronic component 120 in a cross section thereof. For example, a thickness of the frame 115 in the cross section thereof may be about 100 μm to 500 μm.

The metal layers 116, 117, and 118 disposed on the inner surface of the through-hole of the frame 115, the upper surface of the frame 115, and/or lower surface of the frame 115, if necessary, may be to improve heat radiation characteristics and/or block an electromagnetic wave. A material of the metal layers 116, 117, and 118 is not particularly limited as long as it is a metal having high thermal conductivity, such as copper (Cu), aluminum (Al), silver (Ag), tin (Sn), gold (Au), nickel (Ni), lead (Pd), or an alloy thereof, etc. Heat emitted from the electronic component 120 may be dispersed to an upper side or a lower side of the frame 115 through the metal layers 116, 117, and 118 by conduction, radiation, or convection.

Figure 12:
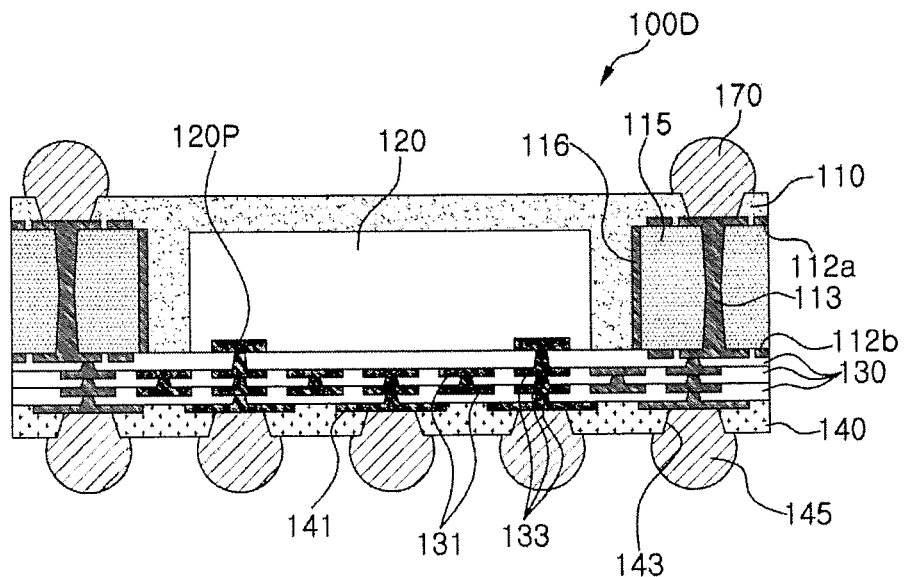
FIG. 12 is a cross-sectional view schematically illustrating another example of an electronic component package.

FIG. 12 is a cross-sectional view schematically illustrating another example of an electronic component package.

Referring to FIG. 12, an electronic component package 100D according to another example may be a package-on-package (PoP) type while being a panel level package (PLP) type. That is, the electronic component package 100D according to another example may further include through-wirings 113 penetrating through the frame 115. Here, various patterns 112a and 112b may be disposed on an upper surface and a lower surface of the frame 115, and a metal layer 116 may be disposed on an inner surface of the through-hole, if necessary. In addition, the electronic component package 100D may further include connection terminals 170 connected to the through-wirings 113. The other components are the same as the components as described above.

The through-wirings 113 may penetrate through only the frame 115, and the number, an interval, a disposition form, and the like, of through-wirings 113 are not particularly limited, but may be sufficiently modified depending on design particulars by those skilled in the art. The connection terminals 170 may be disposed in openings (not denoted by a reference numeral) formed in an upper surface of the encapsulant 110, and the number, an interval, a disposition form, and the like, of connection terminals 170 are not particularly limited, but may be sufficiently modified depending on design particulars by those skilled in the art. The various patterns 112a and 112b disposed on the upper surface and the lower surface of the frame 115 may be wiring and/or pad patterns. Since the wirings may also be formed on the upper surface and the lower surface of the frame 115, as described above, a wider routing region may be provided to the electronic component package 100D. As a result, a degree of freedom of a design of the redistribution layer may be further improved. The metal layer 116 disposed on the inner surface of the through-hole of the frame 115, if necessary, may be to improve heat radiation characteristics and/or block an electromagnetic wave. In a case in which the metal layer 116 is disposed on only the inner surface of the through-hole as described above, a heat radiation effect and an electromagnetic wave blocking effect may be sufficiently accomplished.

Figure 13:
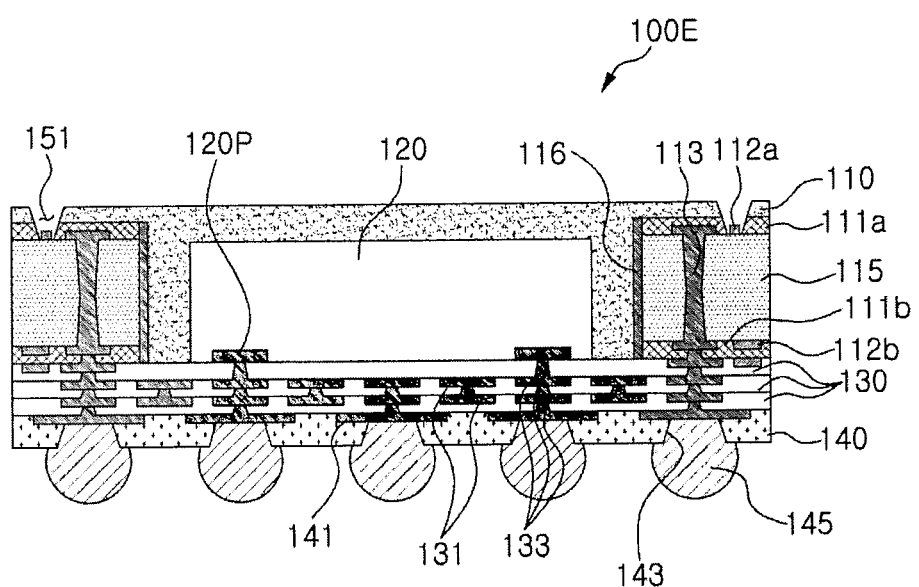
FIG. 13 is a cross-sectional view schematically illustrating another example of an electronic component package.

FIG. 13 is a cross-sectional view schematically illustrating another example of an electronic component package.

Referring to FIG. 17, an electronic component package 100E according to another example may be another package-on-package (PoP) type while being a panel level package (PLP) type. That is, insulating layers 111a and 112b having through-holes integrated with a through-hole of a frame 115 may be further disposed on an upper surface and/or a lower surface of the frame 115. An insulating layer 111a may have openings 151 formed therein so as to penetrate up to the encapsulant 110, and portions of the pattern 112a may be exposed to the outside through the openings 151. The exposed pattern 112a may serve as pads of wire bonding of another electronic component and another electronic component package disposed on the electronic component package 100E. The other components are the same as the components as described above.

The insulating layers 111a and 111b may be to form more wiring patterns before the electronic component 120 is disposed. As the number of insulating layers 111a and 111b is increased, more wiring patterns may be formed on the corresponding layers, such that the number of layers in the redistribution layers 130, 131, 133, 141, and 142 (refer to FIG. 5A-5D) may be decreased. As a result, the probability that the electronic component 120 will not be used due to a defect occurring in a process of forming the redistribution layers 130, 131, 133, 141, and 142 (refer to FIG. 5A-5D) after the electronic component 120 is disposed may be decreased. That is, a problem that a yield is decreased due to a process defect after the electronic component 120 is disposed may be prevented. Through-holes penetrating through the insulating layers 111a and 111b may also be formed in the insulating layers 111a and 111b, and may be integrated with the through-hole penetrating through the frame 115. In this case, the electronic component 120 may be disposed in the integrated through-hole. Various patterns may also be formed on the insulating layers 111a and 111b, and various vias (not denoted by a reference numeral) may also be formed in the insulating layers 111a and 111b.

An insulating material may be used as materials of the insulating layers 111a and 111b. Here, the insulating material may be a thermosetting resin such as an epoxy resin, a thermoplastic resin such as a polyimide resin, a resin having a reinforcement material such as a glass fiber or an inorganic filler impregnated in the thermosetting resin and the thermoplastic resin, for example, prepreg, ABF, FR-4, BT, or the like. In a case in which a photosensitive insulating material such as a photosensitive insulating resin is used as materials of the insulating layers 111a and 111b, the insulating layers 111a and 111b may be formed at a thinner thickness, and a fine pitch may be easily implemented. The respective insulating layers 111a and 111b may contain the same insulating material or different insulating materials. In addition, the insulating layers 111a and 111b may have approximately the same thickness or different thicknesses. In a case in which materials of the insulating layers 111a and 111b are the same as each other, thicknesses of the insulating layers 111a and 111b are approximately the same as each other, and the numbers of insulating layers 111a and 111b are the same as each other, the insulating layers 111a and 111b may be symmetrical to each other in relation to the frame 115, which may be more easy in controlling warpage.

Figure 14:
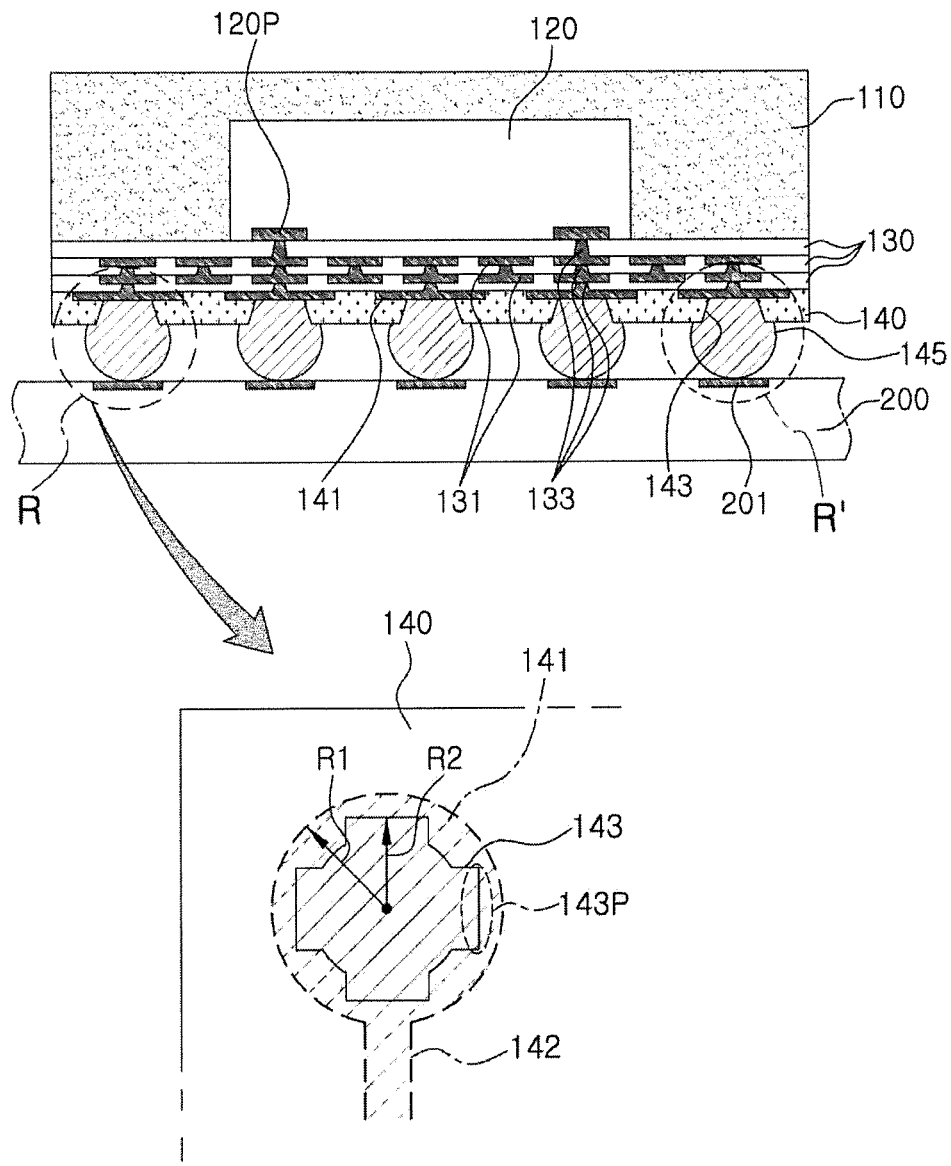
FIG. 14 is a cross-sectional view schematically illustrating an electronic component package according to an example mounted on a circuit board.

FIG. 14 is a cross-sectional view schematically illustrating an electronic component package according to an example mounted on a circuit board.

Referring to FIG. 14, a board 200 may have mounting pads 201 on which an electronic component package is mounted. The electronic component package may be the electronic component packages 100A to 100E described above. Here, in the electronic component package, the openings 143 disposed in at least the regions R and R' in which the stress is concentrated among the openings 143 of the passivation layer 140 exposing the terminal connection pads 141 are implemented to have the plurality of protrusion parts 141P rather than being implemented in the circular shape. Therefore, even in the case in which the warpage is generated in the electronic component package and the main board due to the difference between the CTEs of the electronic component and the main board, the generation of the cracks in the connection terminals 145 may be prevented. The openings 143 disposed in other regions may also have the plurality of protrusion parts 143P.

Figure 15:
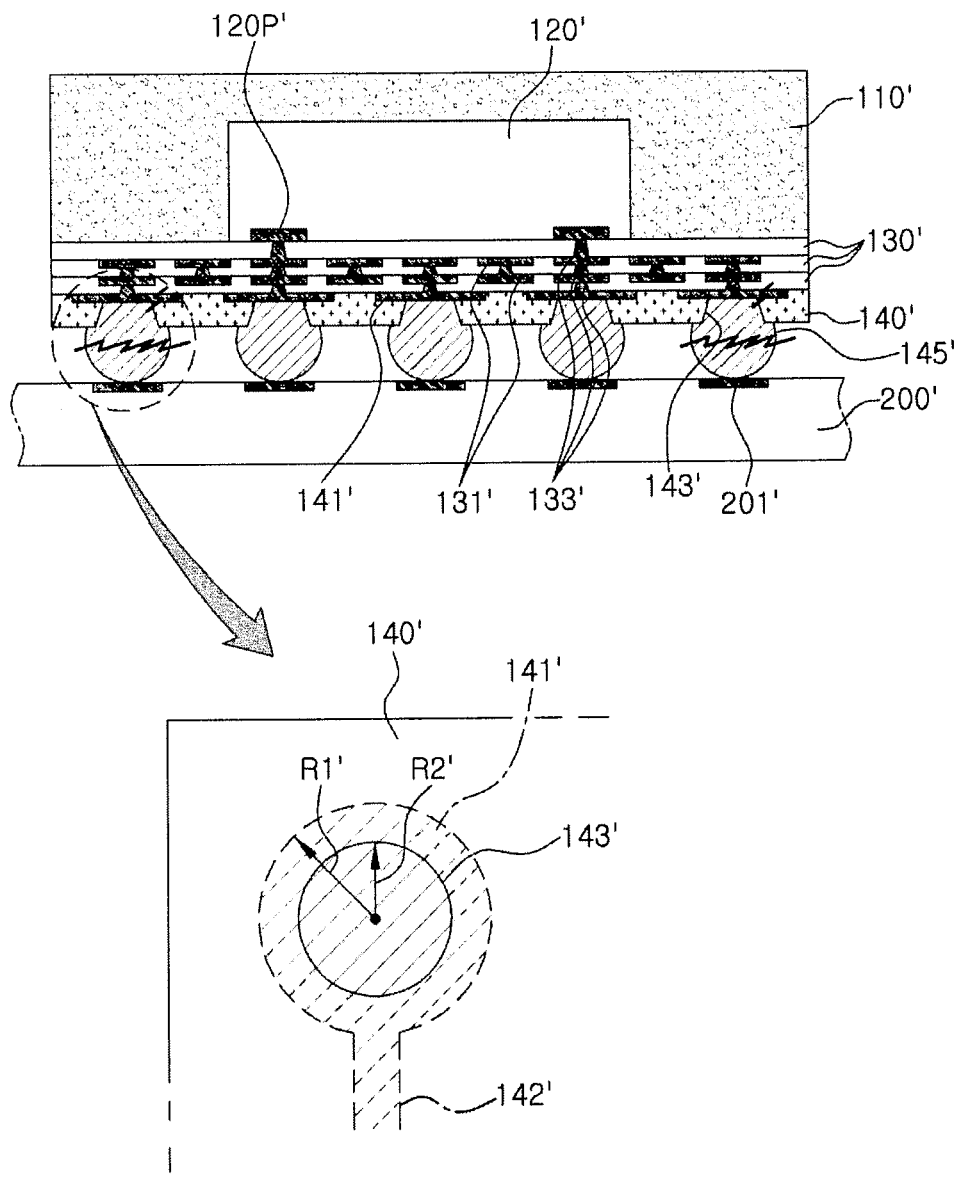
FIG. 15 is a cross-sectional view schematically illustrating a general electronic component package mounted on a circuit board.

FIG. 15 is a cross-sectional view schematically illustrating a general electronic component package mounted on a circuit board.

Referring to FIG. 15, a board 200' may have mounting pads 201' on which an electronic component package is mounted. Here, the electronic component package may include an electronic component 120', redistribution layers 130', 131', 133', 141', and 142', a passivation layer 140', connection terminals 145', an encapsulant 110', and the like, similar to the electronic component packages 100A to 100E described above. However, all of openings 143' of the passivation layer 140' exposing terminal connection pads 141' may be simply implemented in a circular shape. Therefore, in the case in which warpage is generated in the electronic component package and the main board due to the difference between the CTEs of the electronic component 121' and the main board 200', generation of cracks in the connection terminals 145' may not be prevented. In addition, this stress may also be transferred to the terminal connection pads 141', such that cracks may be generated in the terminal connection pads 141'. Therefore, board level reliability may be reduced.

As set forth above, according to an exemplary embodiment in the present disclosure, an electronic component package of which board level reliability is improved, and an electronic device including the same may be provided.

Meanwhile, in the present disclosure, a word "connected" is a concept including a case in which any component is indirectly connected to another component by an adhesive, or the like, as well as a case in which any component is directly connected to another component. In addition, a word "electrically connected" is a concept including both of a case in which any component is physically connected to another component and a case in which any component is not physically connected to another component.

In addition, in the present disclosure, terms "first", "second", and the like, are used to distinguish one component from another component, and do not limit a sequence, importance, and the like, of the corresponding components. In some cases, a first component may be named a second component and a second component may also be similarly named a first component, without departing from the scope of the present disclosure.

In addition, a term "example" used in the present disclosure does not mean the same exemplary embodiment, but is provided in order to emphasize and describe different unique features. However, the above suggested examples may also be implemented to be combined with a feature of another example. For example, even though particulars described in a specific example are not described in another example, it may be understood as a description related to another example unless described otherwise.

In addition, terms used in the present disclosure are used only in order to describe an example rather than limiting the present disclosure. Here, singular forms include plural forms unless interpreted otherwise in a context.

While exemplary embodiments have been shown and described above, it will be apparent to those skilled in the art that modifications and variations could be made without departing from the scope of the present invention as defined by the appended claims.

What is claimed is:

1. An electronic component package comprising:
    an electronic component;
    a redistribution layer electrically connected to the electronic component and having terminal connection pads;
    a passivation layer disposed on one side of the redistribution layer and having openings exposing portions of each of the terminal connection pads; and
    connection terminals disposed in the openings of the passivation layer and electrically connected to the terminal connection pads,
    wherein a first opening of the openings has a plurality of protrusion parts, and exposes a first portion of the portions of a first terminal connection pad of the terminal connection pads, and
    an entire edge of the first terminal connection pad is covered by the passivation layer and is not exposed by any portion of the first opening.

2. The electronic component package of claim 1, wherein the plurality of protrusion parts have a polygonal shape.

3. The electronic component package of claim 1, wherein the passivation layer includes a first region and a second region enclosing the first region, and
    the first opening having the plurality of protrusion parts is disposed in at least one of a peak part of a corner of an outermost side of the first region and a peak part of a corner of an outermost side of the second region.

4. The electronic component package of claim 1, wherein the passivation layer includes a first region, on which the electronic component is disposed, and a second region enclosing the first region, and
    the first opening having the plurality of protrusion parts is disposed in at least one of a corner of an outermost side of the first region and a corner of an outermost side of the second region.

5. The electronic component package of claim 1, wherein the passivation layer includes a first region, on which the electronic component is disposed, and a second region enclosing the first region,
    the first opening having the plurality of protrusion parts is disposed in at least one of an outermost side of the first region and an outermost side of the second region.

6. The electronic component package of claim 1, wherein the passivation layer includes a first region, on which the electronic component is disposed, and a second region enclosing the first region, and
    the first opening having the plurality of protrusion parts is disposed in a corner of an outer side of the second region.

7. The electronic component package of claim 1, wherein the passivation layer includes a first region, on which the electronic component is disposed, and a second region enclosing the first region, and
    the first opening having the plurality of protrusion parts is disposed in at least one of a peak part of a corner of an outermost side of the first region and a portion of the second region enclosing the peak part of corner of the outermost side of the first region.

8. The electronic component package of claim 1, wherein the connection terminals include a plurality of solder balls, each terminal connection pad is a solder ball pad, and the passivation layer is a solder resist layer.

9. The electronic component package of claim 1, wherein the electronic component includes at least one integrated circuit.

10. The electronic component package of claim 1, further comprising an encapsulant encapsulating the electronic component.

11. The electronic component package of claim 1, further comprising a frame disposed on the redistribution layer and having a through-hole,
    wherein the electronic component is disposed in the through-hole of the frame.

12. The electronic component package of claim 11, further comprising:
    a through-wiring penetrating through the frame; and
    wiring patterns disposed on both surfaces of the frame.

13. The electronic component package of claim 1, wherein each of the plurality of protrusion parts of the first opening protrudes from curved edges of the first opening.

14. An electronic device comprising:
    a board; and
    an electronic component package mounted on the board,
    wherein the electronic component package is the electronic component package of claim 1.

15. The electronic component package of claim 1, further comprising a wiring pattern or a pad pattern, the wiring pattern or the pad pattern being positioned at a level between upper and lower surfaces of the electronic component and electrically connected to the electronic component.

* * * * *